US006228720B1

(12) United States Patent
Kitabatake et al.

(10) Patent No.: US 6,228,720 B1
(45) Date of Patent: May 8, 2001

(54) METHOD FOR MAKING INSULATED-GATE SEMICONDUCTOR ELEMENT

(75) Inventors: Makoto Kitabatake, Nara; Masao Uchida; Kunimasa Takahashi, both of Osaka; Takeshi Uenoyama, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/507,714

(22) Filed: Feb. 18, 2000

(30) Foreign Application Priority Data

Feb. 23, 1999 (JP) .................................................. 11-044370

(51) Int. Cl.$^7$ ................................................. H01L 21/336
(52) U.S. Cl. ........................ 438/268; 438/473; 438/516; 438/524
(58) Field of Search ................................... 438/197, 268, 438/473, 514, 524, 516; 148/DIG. 148

(56) References Cited

U.S. PATENT DOCUMENTS

| 4,824,795 | 4/1989 | Blanchard . |
| 4,992,390 | 2/1991 | Chang . |
| 5,723,376 | 3/1998 | Takeuchi et al. . |
| 5,744,826 | 4/1998 | Takeuchi et al. . |
| 5,930,643 | * 7/1999 | Sadana et al. ........................ 438/407 |
| 5,976,936 | 11/1999 | Miyajima et al. . |
| 6,020,600 | 2/2000 | Miyajima et al. . |

FOREIGN PATENT DOCUMENTS

| 196 36 302 A1 | 3/1997 | (DE) . |
| 197 02 110 A1 | 7/1997 | (DE) . |
| 198 09 564 A1 | 9/1998 | (DE) . |
| 0 676 814 A2 | 10/1995 | (EP) . |
| 0 893 830 A1 | 1/1999 | (EP) . |
| 357207366 | * 12/1982 | (JP) . |
| 401238026 | * 9/1989 | (JP) . |
| WO 98/12753 | 3/1998 | (WO) . |

OTHER PUBLICATIONS

Onda et al. "SIC Integrated MOSFETs", *Physica Status Solidi (a)*, vol. 162, No. 1, p. 369–388, 1997.

* cited by examiner

*Primary Examiner*—Long Pham
(74) *Attorney, Agent, or Firm*—Merchant & Gould P.C.

(57) ABSTRACT

An insulated-gate semiconductor element with a trench structure is provided, which has a high breakdown voltage even though a silicon carbide substrate is used that is preferable to obtain a semiconductor element with favorable properties. The surface of a silicon carbide substrate is etched to form a concave portion. Then, a particle beam, for example an ion beam, is irradiated from above, and a defect layer is formed at least in a bottom surface of the concave portion. The substrate is heated in an oxidation atmosphere, and an oxide film is formed at least on a side surface and the bottom surface of the concave portion. Then, a gate electrode is formed on the oxide film. With this method, the oxide film at the bottom surface of the concave portion is thicker than the oxide film at the side surfaces of the concave portion, so that a high breakdown voltage can be ensured, even when the surface of the silicon carbide layer is a face with which a superior epitaxial layer can be attained, such as the (111) Si-face of β-SiC or the (0001) Si-face of α-SiC.

11 Claims, 6 Drawing Sheets

METHOD FOR MAKING INSULATED-GATE SEMICONDUCTOR ELEMENT

BACKGROUND OF THE INVENTION

1. Field of the Invention

The present invention relates to a insulated-gate semiconductor element using a silicon carbide substrate, and more particularly, to a vertical insulated-gate semiconductor element having a so-called trench structure. Furthermore, the present invention relates to a method for manufacturing such an insulated-gate semiconductor element.

2. Description of the Prior Art

In insulated-gate semiconductor elements using silicon carbide, the surface of a silicon carbide substrate is oxidized to form a silicon oxide film (oxide film), which is used as a gate insulator. Vertical silicon carbide insulated-gate semiconductor elements with a trench structure have been developed as high-power elements having high breakdown voltage and large current capacities.

FIG. 5 shows a cross section of a conventional vertical silicon carbide insulated-gate semiconductor element. This semiconductor element is made using a silicon carbide substrate as shown in FIG. 6. For this silicon carbide substrate, an n-type epitaxial layer 102 and a p-type epitaxial layer 103 are formed by CVD on top of a conductive $n^+$-type substrate 101 of silicon carbide. On the surface of this substrate, an $n^+$-layer 104 is partially formed by local ion implantation and annealing. As a result, a layered structure of $n^+$/p/n is formed in that order from the surface in the silicon carbide substrate. To obtain the trench structure by photo-lithography and etching from the surface of the substrate, a concave portion 105 is formed in this layered structure.

A silicon oxide film (oxide film) 110 is formed by oxidation on the substrate. The oxide film 110 is etched and removed except at side surfaces 111 of the concave portion (i.e. wall surfaces of the trench structure), a bottom surface 109 of the concave portion (i.e. the bottom surface of the trench structure), and a substrate surface 106 near the concave portion. A gate electrode 112 and an insulating film 116 are formed on top of the oxide film 110. Then, a source electrode 113 and a drain electrode 114 are formed on the two surfaces of the substrate 101. The channel 115, which is switched on and off by applying a voltage to the gate electrode 12, is formed at the interface between the p-type epitaxial layer 103 and the oxide layer 110.

This conventional technique is described, for example, in Silicon Carbide; A Review of Fundamental Questions and Applications, edited by W. J. Choyke, H. Matsunami, and G. Pensl, Akademie Verlag, 1997, Vol. II, pp. 369–388.

Silicon carbide has different oxidation speeds depending on the crystal orientation. For example, the (0001) Si-face of α-SiC has the slowest oxidation speed, whereas the (000$\bar{1}$) C-face of α-SiC attained by rotation for 180° has the highest oxidation speed. Therefore, when the concave portion is formed and the substrate including surfaces corresponding to several different crystal orientations is oxidized, the thicknesses of the formed oxide films will be different. When the thickness of the oxide film is not uniform throughout the trench structure, the electric field created in the oxide film depending on the voltage applied to the gate electrode also will be not uniform.

When the surface of the silicon carbide substrate is the (0001) Si-face of α-SiC, an epitaxial layer with superior crystallinity can be obtained. However, when an insulated-gate semiconductor element is made using this surface, a relatively thin oxide film 110 is formed on the substrate surface 106 and the trench bottom surface 109, and a relatively thick oxide film 110 is formed on the trench wall surfaces 111, as shown in FIG. 5. In this situation, the electric field applied to the oxide film on the trench bottom surface 109 is larger than the electric field applied to the channel portion 115 of the trench wall surfaces 111. Therefore, if an oxide film of the necessary thickness to maintain the breakdown voltage is formed on the trench bottom surface, an even thicker oxide film will be formed near the channel 115, which results in the problem that the response efficiency of the element with regard to the gate voltage is inferior.

If, on the other hand, the thickness of the oxide film 110 at the trench wall surfaces 111 is adjusted in consideration of the response time of the element, then the oxide film 110 at the trench bottom surface 109 becomes thin, and the breakdown voltage of the element decreases.

To make such an element using the (000$\bar{1}$) C-face of α-SiC, a thick silicon oxide film is formed on the surface of the silicon carbide substrate and the trench bottom surface, and a thin silicon oxide film is formed on the trench wall surfaces. Such an insulated-gate semiconductor element is superior with regard to the distribution of the silicon oxide insulating film thickness, but the crystallinity of the epitaxial layer is inferior to that of an epitaxial layer formed on the (0001) Si-face of α-SiC. Therefore, it cannot provide a semiconductor element with suitable properties.

Thus, with conventional insulated-gate semiconductor elements, it has been a problem to increase the breakdown voltage while maintaining good semiconductor element properties.

SUMMARY OF THE INVENTION

It is therefore an object of the present invention to provide an insulated-gate semiconductor element with a high breakdown voltage while using a preferable surface of the silicon carbide substrate to attain superior semiconductor element properties. It is a further object of the present invention to provide a method for manufacturing an insulated-gate semiconductor element with high breakdown voltage while maintaining superior semiconductor element properties.

To achieve these objects, a method for manufacturing an insulated-gate semiconductor element comprises etching a surface of a silicon carbide substrate to form a concave portion on the surface; irradiating a particle beam from above the surface to form a defect layer in at least a bottom surface of the concave portion; heating the silicon carbide substrate in an oxidation atmosphere to form an oxide film of silicon carbide on at least a side surface of the concave portion and the bottom surface in which the defect layer has been formed; and forming a gate electrode on the oxide film.

In the region where the defect layer is formed, the oxidation speed is higher than in the region that is not subjected to defects. Consequently, this manufacturing method of the present invention improves the breakdown voltage by making the oxidation layer at the bottom surface of the concave portion thicker.

It is preferable that the surface of the silicon carbide substrate is a (111) Si-face of β-SiC or a (0001) Si-face of α-SiC. An example of a (111) Si-face of β-SiC is the (111) Si-face of 3C-SiC, which is a cubic crystal. Examples of a (0001) Si-face of α-SiC include the Si-faces of 4H (hexagonal crystal), 6H and of 15R-SiC (rhombohedral crystal). Using these Si-faces, epitaxial layers with superior crystallinity can be obtained. As will be explained in more detail below, with the manufacturing method of the present invention, the oxide film at the bottom surface of the concave portion can be made thicker than the oxide film at the side surfaces of the concave portion, while using these substrate surfaces.

It is preferable that the silicon carbide substrate includes a multi-layer structure of a silicon carbide substrate of a first conductivity type, a first layer of a first conductivity type formed on the silicon carbide substrate of the first conductivity type, and a second layer of a second conductivity type formed on the first layer of the first conductivity type. The first and second layers can be formed by ion implantation and are preferably epitaxial layers.

It is preferable that the concave portion is formed so that the side surface of the concave portion and the surface of the silicon carbide substrate define an angle between 80° and 120°, because this leads to a suitable distribution of the defect layer.

It is preferable that the manufacturing method of the present invention further comprises, after forming the concave portion and before irradiating the particle beam, forming an epitaxial layer on at least the side surface of the concave portion.

For the particle beam of the present invention, it is possible to use an electron beam or a radioactive beam, but an ion beam is preferable. It is preferable that the ion beam uses ions of a non-metal element, in particular at least one selected from the group consisting of silicon, oxygen, nitrogen, hydrogen and inert gas ions, because these ions do not tend to remain in the oxide film after heating. Silicon ions turn into silicon dioxide.

It is preferable that the energy of the ion beam is between 1 keV and 10 MeV. It is preferable that the ion implant dose is at least $10^{14}$ $cm^{-2}$.

It is preferable that particle beams of different energies are irradiated. When ion beams are used for the particle beams, it is preferable that the energy of each of the ion beams is selected from the range of 1 keV to 10 MeV. Moreover, it is preferable that the particle beam is irradiated while keeping the silicon carbide substrate at a temperature of not more than 500° C.

To achieve the above objects, an insulated-gate semiconductor element in accordance with the present invention comprises a silicon carbide substrate having a surface including a (111) Si-face of β-SiC or a (0001) Si-face of α-SiC; a concave portion formed on the surface; an oxide film of silicon carbide formed at least on a bottom surface and a side surface of the concave portion; a gate electrode formed on the oxide film; wherein the oxide film formed on the bottom surface is thicker than the oxide film formed on the side surface.

With an insulated-gate semiconductor element of the present invention, a suitable thickness distribution of the oxide layer at the bottom surface and the side surfaces of the concave portion can be attained while using a surface of the silicon carbide substrate where an epitaxial layer with superior crystallinity can easily be attained.

It is preferable that the side surface of the concave portion and the surface of the silicon carbide substrate define an angle between 80° and 120°. It is also preferable that the insulated-gate semiconductor element formed on a Si-face of the present invention has a breakdown voltage of at least 400V.

It is preferable that the silicon carbide substrate includes a multi-layer structure of a silicon carbide substrate of a first conductivity type, an epitaxial layer of a first conductivity type formed on the silicon carbide substrate of the first conductivity type, and an epitaxial layer of a second conductivity type formed on the epitaxial layer of the first conductivity type.

It is preferable that the insulated-gate semiconductor element of the present invention further comprises an epitaxial layer formed between the concave portion and the oxide film.

DESCRIPTION OF THE PREFERRED EMBODIMENTS

The following is a more detailed description of the preferred embodiments of the present invention, with reference to the accompanying drawings.

Figure 1A:
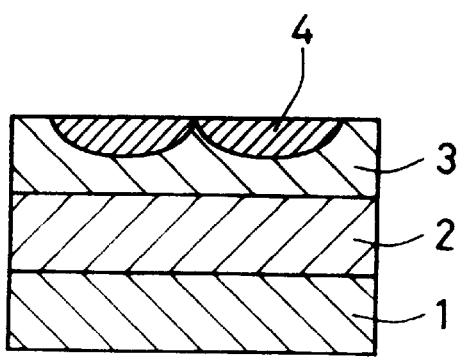
FIG. 1(a)–1(e) is a diagram illustrating the steps of a manufacturing method of the present invention by cross-sectional views of a semiconductor element.

First, an n-type epitaxial layer 2, and a p-type epitaxial layer 3 are formed in that order on, for example, the α-SiC (0001) Si-face of an n⁺-type silicon carbide substrate 1, as shown in FIG. 1A. Then, an n⁺-type layer 4 is formed on the surface of the p-type epitaxial layer 3 by partial ion implantation and annealing.

Figure 1B:
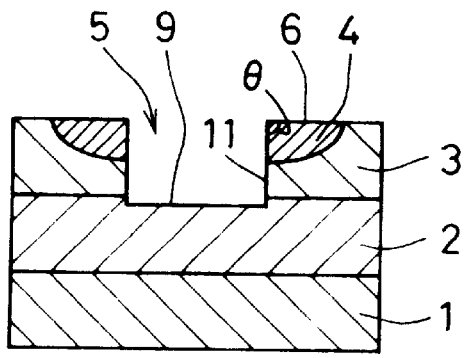

The resulting surface of the silicon carbide substrate is etched to form a concave portion 5, as shown in FIG. 1B. This concave portion is formed inside the region where the n⁺-layer 4 has been formed. The bottom surface 9 of the concave portion (i.e., the bottom of the trench structure) is preferably formed so that it lies inside the n-type epitaxial layer 2.

The angle θ between the side surface 11 of the concave portion (i.e. the side of the trench structure) and the substrate surface 6 is preferably between 80° and 120°. In the next step, ion bombardment of the trench wall surfaces 11 is kept at a low density, while performing ion bombardment of high density at the substrate surface 6 and the trench bottom surface 11, especially at the trench bottom surface 11.

Figure 1C:
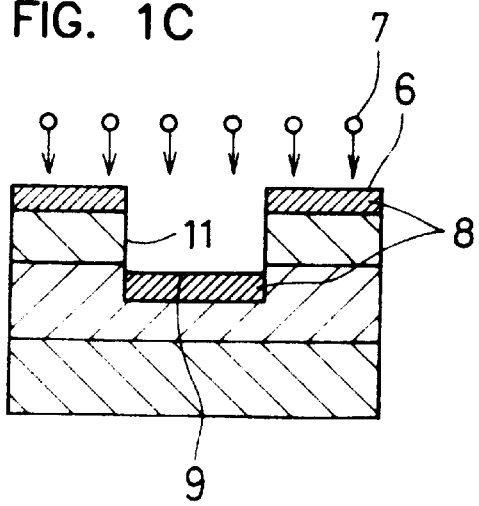

Then, ions 7 are implanted from above the substrate surface 6, as shown in FIG. 1C. The ion beam is irradiated from substantially vertically above the substrate surface 6. This ion beam irradiation forms irradiation defect layers 8 in the trench bottom surface 9 and the substrate surface 6 near the concave portion.

If the angle θ is in the above-noted range, the ions enter the trench wall surfaces only at a very narrow angle, even when the ion beam widens up only slightly. Consequently, ion defects are also formed in a very shallow region near the surface. If the angle θ is less than 80°, the trench wall surfaces may cover up a portion of the trench bottom surface, so that it cannot be reached by the ion irradiation. If the angle θ is larger than 120°, the irradiation defect layer in the trench wall surfaces may become too deep.

Suitable ions 7 to be irradiated include silicon, oxygen, nitrogen, hydrogen and inert gases, such as helium, neon, and argon. It is also possible to use a combination of different kinds of ions. Oxygen ions add to the oxidation of the silicon carbide when remaining after implantation into the silicon carbide. Nitrogen, hydrogen and inert gases do not form strong bonds with the silicon atoms and the carbon atoms when remaining after implantation into the silicon carbide, so that they can hardly prevent the formation of an oxide film.

The energy of the ion beam is preferably between 1 keV and 10 MeV. If the energy is less than 1 keV, it is difficult to form a thick irradiation defect layer at the trench bottom surface 9. And with an ion beam of an energy higher than 10 MeV, formation of the beam becomes difficult.

Superior irradiation defect layers can be achieved with multiple implantation using ion beams of two or more different energies. Irradiation defect layers formed with implantation of ion beams having high energies are formed in portions far away from the surface. When such substrates with few defects near the surface are oxidized, an oxide film is not formed effectively, unless the oxidation reaches the defect portion. However, with multiple implantation as described above, an irradiation defect layer that is continuous from the surface can be formed, and as a result, a thick oxide film can be formed effectively.

It is preferable that the implant dose of the ions 7 is at least $10^{14}$ cm$^{-2}$. If the implant dose is insufficient, the density of the irradiation defects formed in the silicon carbide may not become high enough to effectively advance the oxidation. There is no particular restriction with regard to the upper limit of the implant dose, but ca. $10^{18}$ cm$^{-2}$ is suitable.

It is preferable that the temperature of the silicon carbide substrate during the ion implantation is kept at 500° C. or less. If the temperature of the silicon carbide substrate is higher than 500° C., there is the possibility of the irradiation defects being eliminated due to annealing during the ion irradiation.

With an ion implantation as described above, an irradiation defect layer is formed in the surface of the silicon carbide substrate. To attain the objects of the present invention, the defect level of the silicon carbide in the irradiation defect layer should be such that the regularity in the crystallinity of the silicon carbide is not damaged. However, it is preferable that the irradiation defect layer is formed as a layer than can be regarded as a substantially amorphous layer. Here, "amorphous layer" means a layer where substantially no periodicity can be observed in the ordering of the atoms.

Figure 1D:
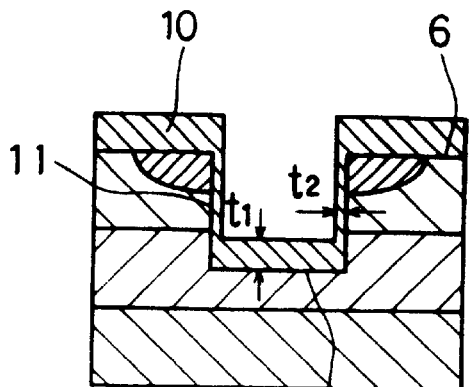

Next, the substrate surface including the irradiation defect layer 8 is heated in an oxidizing atmosphere to form an oxide film 10 as shown in FIG. 1D. Oxidation due to heating progresses more easily in the irradiation defect layer where the periodicity of the atom arrangement has been damaged than in the crystalline silicon carbide. Therefore, in those regions where the irradiation defect layers 8 have been formed, the oxide film grows faster than in the regions without defects and in the regions where the defect level is low. Thus, the oxide film 10 is formed thin on the trench wall surfaces 11, and thick at the trench bottom surface 9 and at the substrate surface 6.

It is preferable that the ratio $t_1/t_2$ between the thickness $t_1$ of the oxide film at the bottom surface and the thickness $t_2$ at the wall surfaces of the trench is at least one (more preferably 1.5). The ratio $t_1/t_2$ is preferably 10 or less since the ratio of more than 10 is not easy to be realized.

There is no particular restriction with regard to the oxidation atmosphere, as long as it can oxidize silicon carbide. For example, it is possible to use an oxygen atmosphere, but it is also possible to use an atmosphere containing oxygen, such as air, or an atmosphere containing water vapor.

Figure 1E:
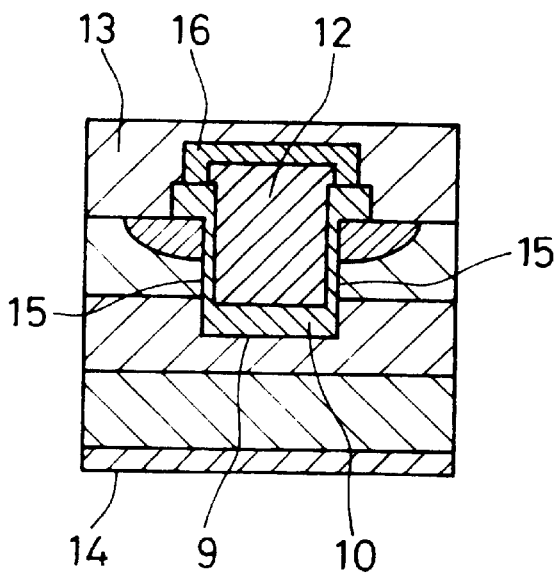

Then, the oxide film 10 is patterned, and a gate electrode 12, an insulating film 16, and a source electrode 13 are formed in that order, as shown in FIG. 1E. The gate electrode 12 is formed on top of the oxide film 10 along the wall surfaces and the bottom surface of the trench. An insulating film 16 is formed covering this gate electrode. The source electrode 13 is formed contacting the n$^+$-type layer 4, which has been formed before. On the other hand, a drain electrode 14 is formed at the other surface of the silicon carbide substrate. The source electrode 13 and the drain electrode 14 are arranged vertically and sandwich the substrate. Conventional methods can be used to form these electrodes and the insulating film. For example, the insulating film 16 can be made by forming a silicon oxide film or a silicon nitride film by CVD, for example.

In the insulated-gate semiconductor element shown in FIG. 1E, the oxide film on the trench bottom surface 9 is thicker than the oxide film on the trench wall surfaces. Consequently, it is easy to ensure a breakdown voltage (for example, at least 400V) while applying an electric field on the channel portion 15 effectively with the gate electrode 12. Here, "breakdown voltage" means a voltage when a leakage current in an OFF state between the source electrode and the drain electrode reaches 100 μA, which in this embodiment substantially depends from the breakdown voltage between the gate electrode and the drain electrode.

Figure 2:
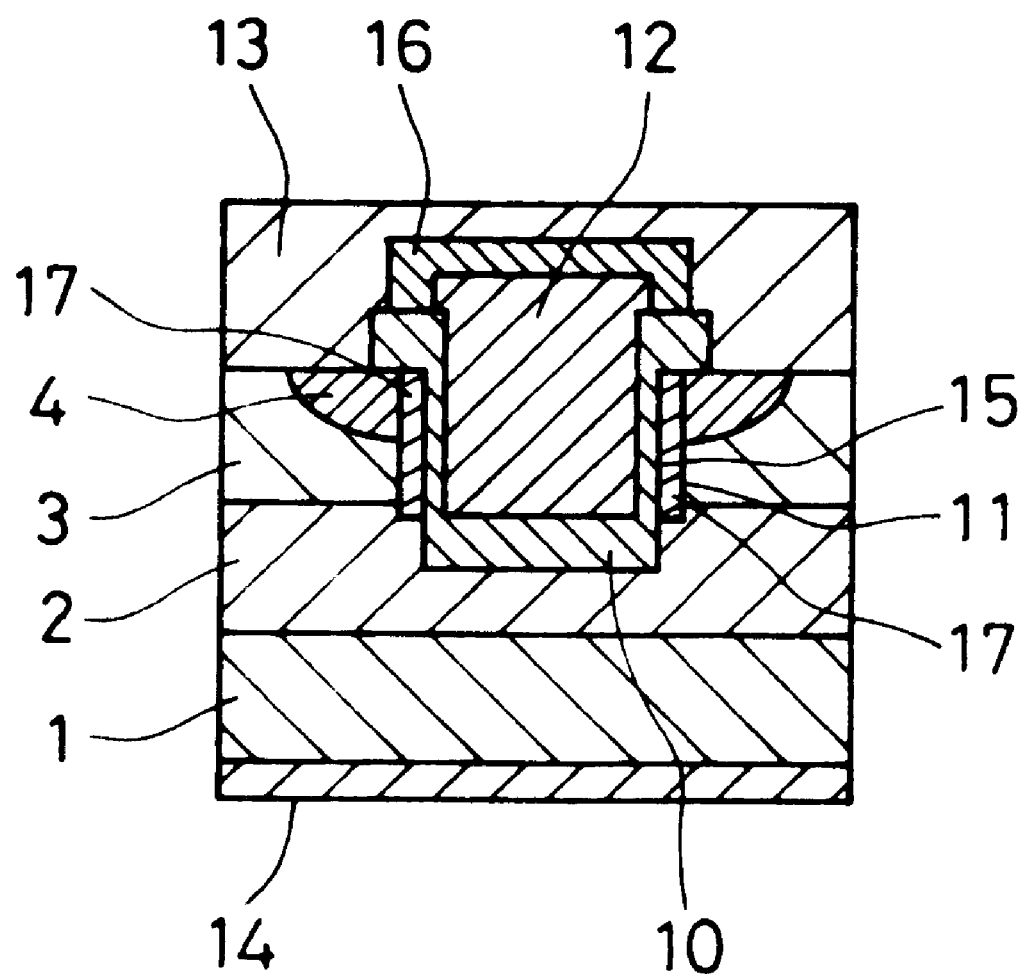
FIG. 2 is a cross-sectional view showing an embodiment of an insulated-gate semiconductor element in accordance with the present invention.

In the above-described manufacturing method, it is also possible to form another epitaxial layer on the trench wall surfaces 11 after forming the concave portion (FIG. 1B) and before the ion implantation (FIG. 1C). In this case, preferable results can be attained in that the oxide film 10 formed in the trench wall surfaces after the oxidation can be formed by oxidation of the epitaxial layer. Especially, when the epitaxial layer is not p-type, charge concentrations caused by the trap level in the oxide film can be kept low, so that even better MOS characteristics can be attained. FIG. 2 shows a cross-sectional view of an insulated-gate semiconductor element obtained by forming an additional epitaxial layer 17 and then oxidizing it.

Conventionally, with trench structures formed in the (0001) Si-face of α-SiC, there was the problem that the thickness of the oxide film in the trench wall surfaces became relatively thicker than the thickness of the film at the bottom surface. However, with the above-described embodiment of the present invention, the oxide film formed in this Si-face can be made thicker than the oxide film formed on the wall surfaces of the trench structure.

The present invention is not limited to this embodiment, in particular, there are no limitations with regard to the substrate surfaces, particle beams, shape of the concave portion, and conductivity type of layers and substrate for which the present invention can be used. For example, the cross-section shape of the concave portion also can be U-shaped instead of rectangular.

EXAMPLE 1

An insulated-gate semiconductor element has been prepared with the method illustrated in FIGS. 1A to 1E. First of all, a silicon carbide substrate with a (0001) Si surface (4° offcut in [11$\bar{2}$0] direction) of n-type 6H-SiC doped with nitrogen at a concentration of $3\times10^{18}$ cm$^{-3}$ was prepared, and after rinsing the surface, an n-type epitaxial layer of 6 μm thickness doped with $5\times10^{15}$ cm$^{-3}$ nitrogen was formed on the substrate surface. On top of this layer, a p-type epitaxial layer of 2 μm thickness doped with $2\times10^{17}$ cm$^{-3}$ Al was formed. Then, nitrogen ions were implanted locally into the surface of this p-type epitaxial layer at 200 keV energy, and an n$^+$-layer was formed on the surface by heating. The implant dose of nitrogen was $5\times10^{15}$ cm$^{-2}$.

This layered substrate using the (0001) Si-face of 6H-SiC was etched by reactive ion etching (RIE) with a mixed gas of CF$_4$ and O$_2$, and a substantially U-shaped concave portion of 3 μm depth was formed. The angle between the wall surfaces of the trench structure and the substrate surface (i.e. angle θ in FIG. 1B) was about 90° (±5°).

Then, oxygen ions were implanted from above the surface of the layered substrate. The oxygen ions were implanted by multiple beams of 150 keV and 30 keV at implant doses of $1\times10^{15}$ cm$^{-2}$ each. The temperature of the substrate was kept below 100° C. by water cooling. Thus, an amorphous defect layer was formed by irradiation defects in the substrate surface, which was kept at low temperatures. This defect layer was formed selectively in surface regions of the substrate near the trench structure and at the trench bottom surface.

The substrate with the introduced defects was put into an oxidation furnace, and oxidized by wet oxidation for three hours at 1100° C. This oxidation formed a 280 nm oxide film at the substrate surface and the trench bottom surface including the irradiation layer. The thickness of the oxide film on the trench wall surfaces was 100 nm.

Next, a source electrode, a drain electrode, and a gate electrode were formed, resulting in the structure shown in FIG. 1E. The gate electrode was formed as a polysilicon film, whereas the source electrode and the drain electrode were formed by depositing an ohmic electrode of Ni, followed by heating. Insulating films for insulating the gate electrode from the source electrode were formed by CVD. Thus, an insulated-gate semiconductor element was obtained.

Another insulated-gate semiconductor element was formed in the same manner as above, except that the ion implantation has been omitted. The breakdown voltage of this semiconductor element was less than half the breakdown voltage of the semiconductor element in which the ion implantation has been performed (at least 400V). Without the ion implantation, the thickness of the oxide film at the trench bottom surface was about 30 nm, which is thinner than the oxide film at the trench wall surfaces.

In the same fashion, semiconductor elements were prepared on the Si-faces of β-SiC(111), 4H α-SiC(0001) and 15R-SiC, and it was confirmed that the thickness distribution of the oxide film could be adjusted as described above. It also could be confirmed that the properties were improved when the uppermost n$^+$-layer was formed by epitaxial growth instead of ion implantation. Similarly, the properties were improved when a multi-layer structure of epitaxial layers was formed by ion implantation. The same effects could be attained when nitrogen, hydrogen or an inert gas were used instead of oxygen ions.

EXAMPLE 2

In this example, an insulated-gate semiconductor element having the same cross section as the structure in FIG. 2 was prepared. That is to say, while the basic manufacturing steps were the same as in Example 1, after the concave portion has been formed by RIE-etching, an epitaxial layer was formed on the surface of the concave portion before implanting oxygen ions.

To be specific, the substrate was placed in a CVD epitaxial growth device, and an n-type epitaxial layer of 50 nm thickness doped with nitrogen at $10^{15}$ cm$^{-3}$ was formed on its surface. This additional epitaxial layer was formed with substantially identical thickness on the trench wall surfaces, the trench bottom surface and the surface near the trench structure.

After the additional epitaxial layer has been formed in at least a region including the trench wall surfaces, ion implantation and oxidation were performed under the same conditions as in Example 1. At the trench bottom surface and the substrate surface, the additional epitaxial layer was subjected to high-density ion bombardment due to ion implantation, and was entirely oxidized into an oxide film in an oxidation process. After this oxidation, the additional epitaxial layer remained practically only at the trench wall surfaces.

The insulated-gate semiconductor element obtained by the oxidation after forming the additional epitaxial layer had an oxide film formed by oxidation of a low-density n-type epitaxial layer at a channel portion on the trench wall surfaces. Therefore, not only could the breakdown voltage be raised as in Example 1, but, as in Example 1, it was possible to keep the density of trap levels low and obtain superior MOS properties, even though an oxide film was formed by oxidizing the p-type silicon carbide. In particular, the channel mobility of the insulated-gate semiconductor element in this Example 2 was at least 20% higher than in elements of Example 1. Thus, by forming an additional epitaxial layer, a superior silicon carbide semiconductor/silicon oxide insulator interface was formed, and a channel with high mobility could be obtained.

In this example, a nitrogen-doped n-type additional epitaxial layer has been formed, but the additional epitaxial layer is not limited to this, and it was confirmed that in the same manner as described above, high channel mobilities could be attained, as long as the epitaxial layer was not p-type.

EXAMPLE 3

Figure 3:
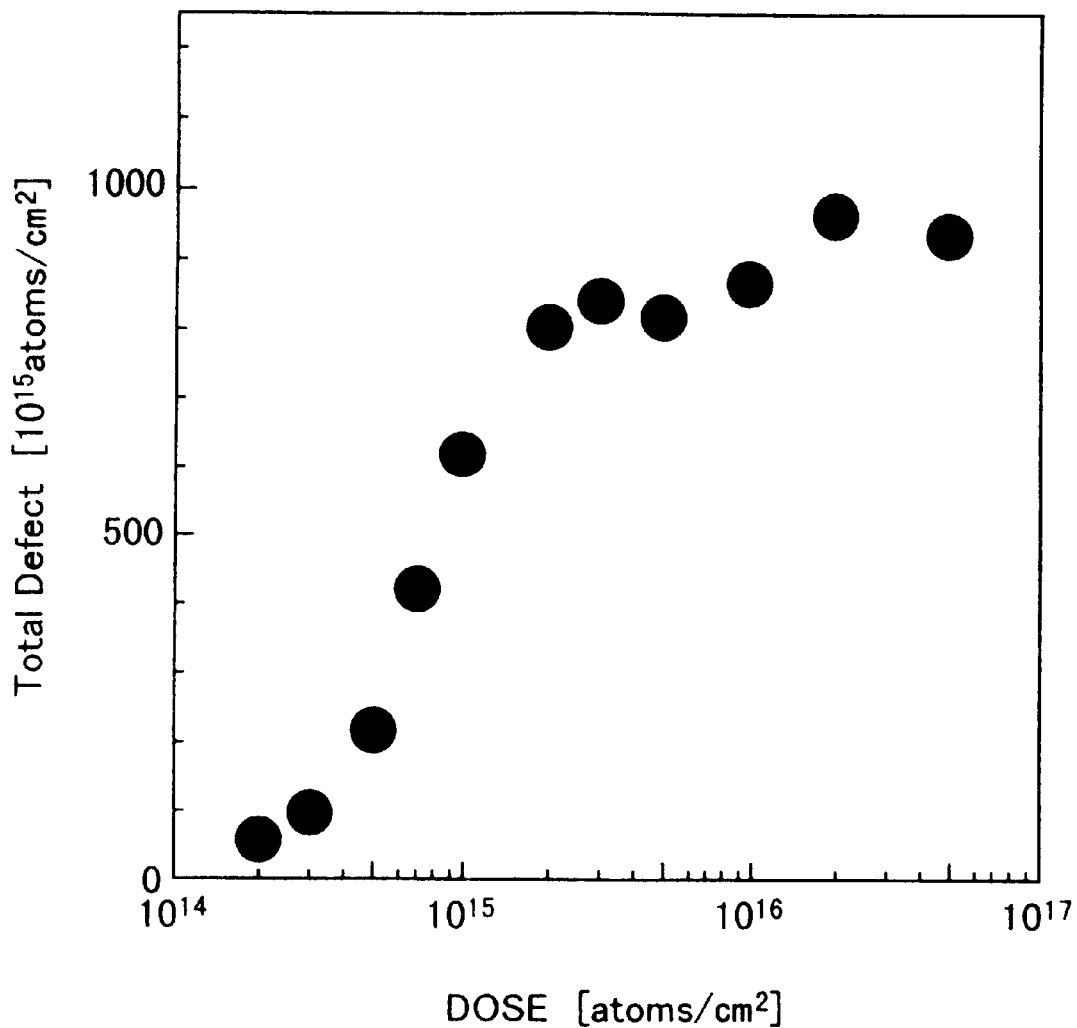
FIG. 3 is a graph showing the defect density in the silicon carbide as a function of the ion implant dose in embodiments of the present invention.
Figure 4:
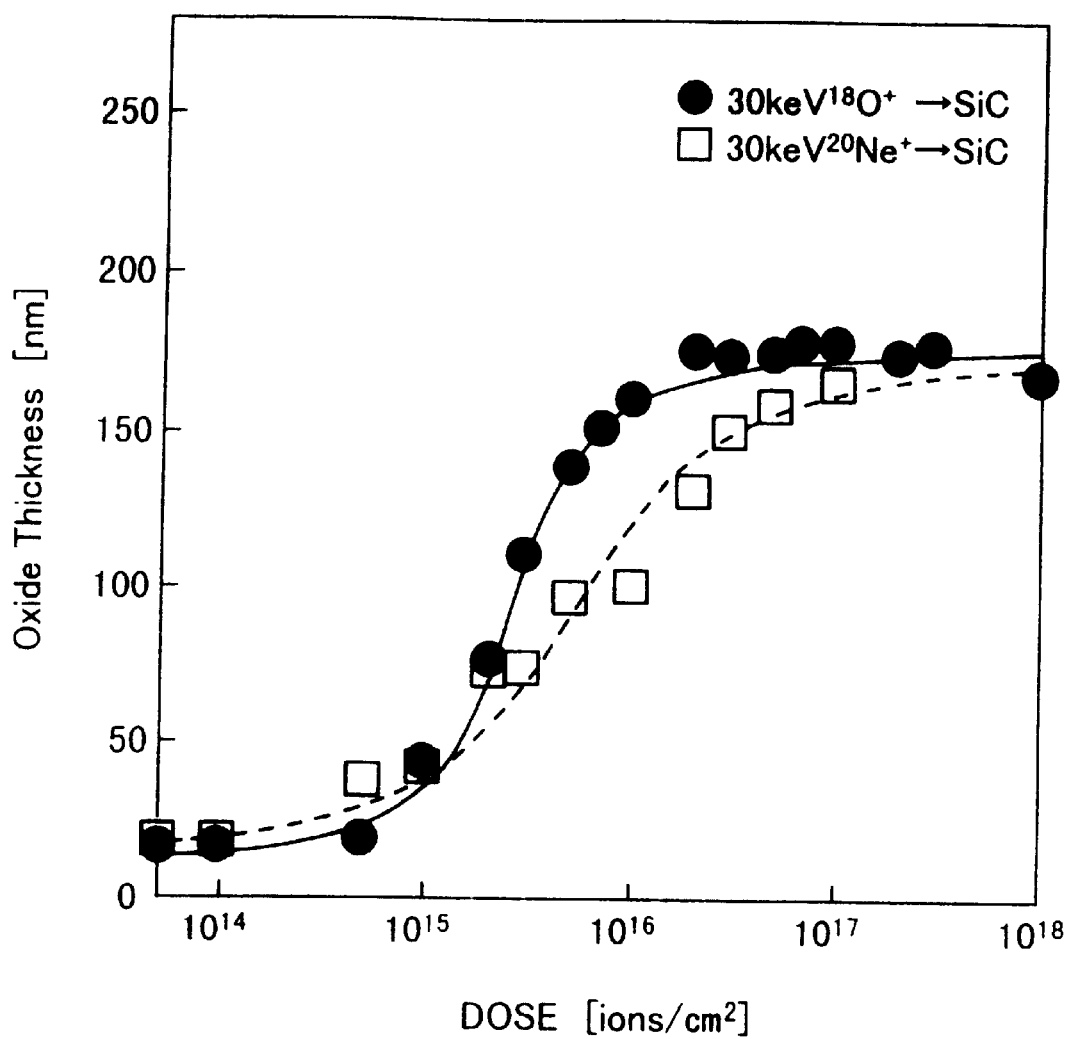
FIG. 4 is a graph showing the thickness of the oxide film obtained by oxidation as a function of the ion implant dose in embodiments of the present invention.
Figure 5:
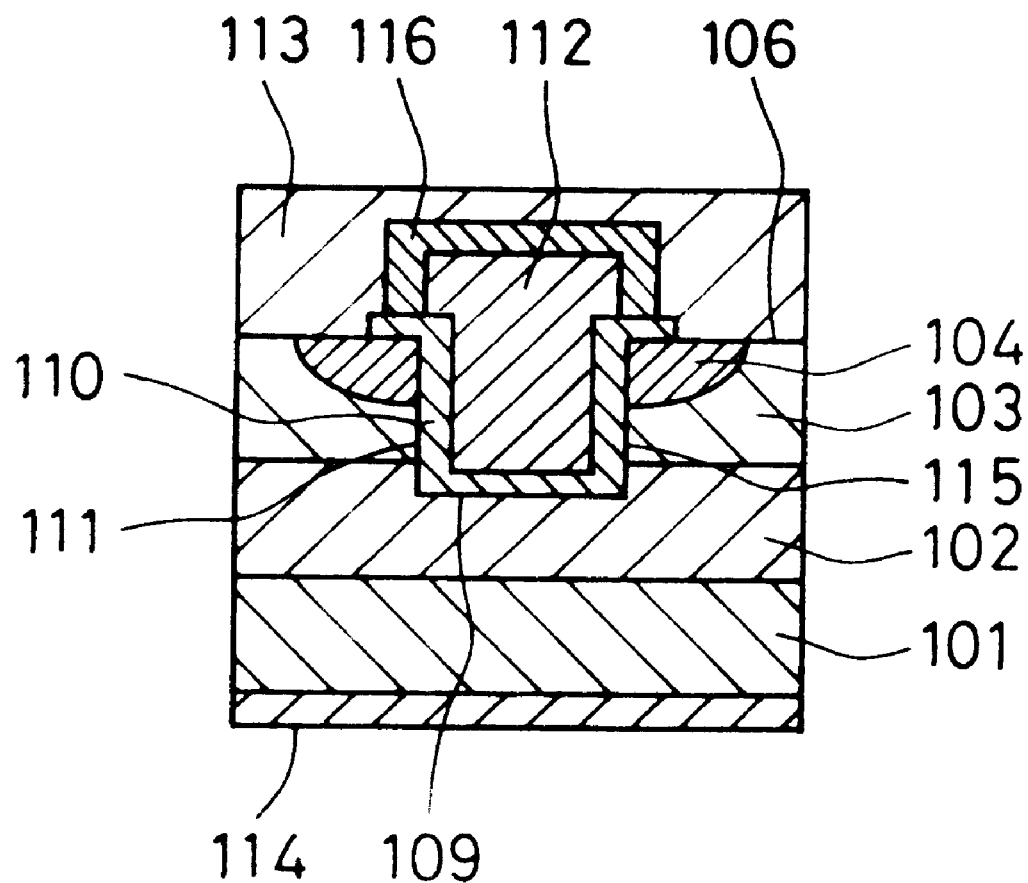
FIG. 5 is a cross-sectional view of a conventional insulated-gate semiconductor element.
Figure 6:
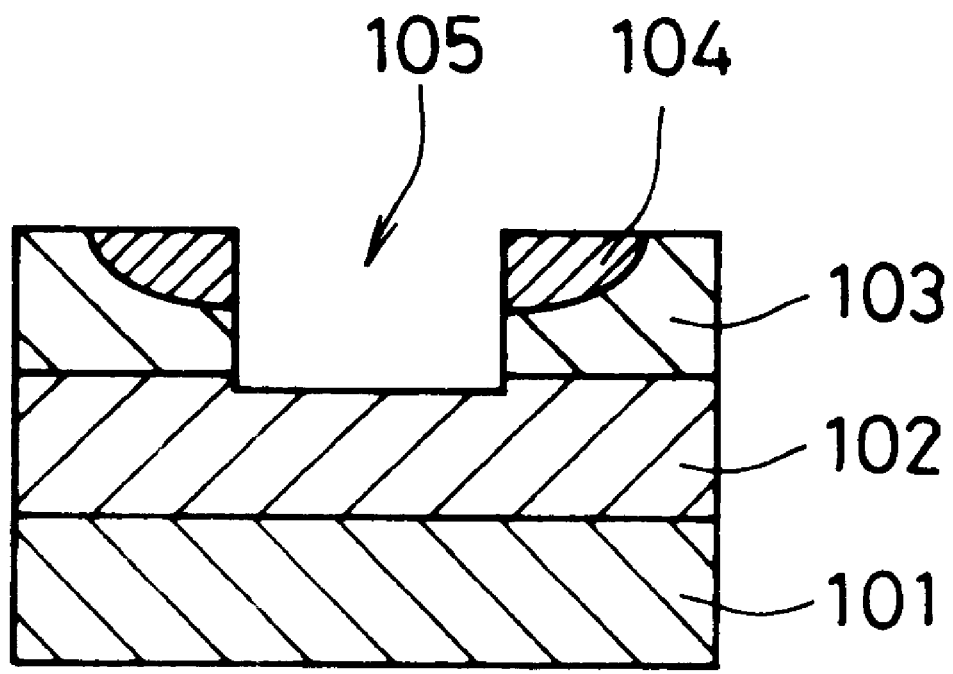
FIG. 6 is a cross-sectional view of a silicon carbide substrate used for conventional insulated-gate semiconductor elements.

Suitable implant doses were determined. FIG. 3 shows the defect density as a function of the implant dose for oxygen ion implantation at 30 keV on a 4° off (0001) Si-face of 6H-SiC, as above. The defect density was measured by Rutherford backscattering spectrometry (RBS). FIG. 4 shows the thickness of the oxide film as a function of the implant dose for implantations of oxygen ions and neon ions at 30 keV on a 4° off (0001) Si-face of 6H-SiC, as above. The implanted ions were $^{18}$O$^+$ and $^{20}$Ne$^+$. Comparing FIGS. 3 and 4, it can be confirmed that the amount of defects introduced by ion implantation is directly correlated to the thickness of the oxide film.

Moreover, oxygen ions are more effective than neon ions to form a thick oxide film. As is shown in FIGS. 3 and 4, there are preferable ranges of ion implant doses, which depend on the type of ions. A generally preferable range of ion implant doses is $10^{15}$ cm$^{-2}$ to $10^{18}$ cm$^{-2}$. A preferable range of implant doses for implanting oxygen ions under the above conditions is $10^{16}$ cm$^{-2}$ to $10^{18}$ cm$^{-2}$. A preferable range of implant doses for implanting neon ions under the above conditions is $10^{17}$ cm$^{-2}$ to $10^{18}$ cm$^{-2}$.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for manufacturing an insulated-gate semiconductor element, comprising:

etching a surface of a silicon carbide substrate to form a concave portion on the surface;

irradiating a particle beam from above the surface to form a defect layer in at least a bottom surface of the concave portion;

heating the silicon carbide substrate in an oxidation atmosphere to form an oxide film of silicon carbide on at least a side surface of the concave portion and the bottom surface in which the defect layer has been formed; and forming a gate electrode on the oxide film.

2. The method of claim 1, wherein the surface of the silicon carbide substrate is a (111) Si-face of β-SiC or a (0001) Si-face of α-SiC.

3. The method of claim 1, wherein the silicon carbide substrate includes a multi-layer structure of a silicon carbide substrate of a first conductivity type, a first layer of the first conductivity type formed on the silicon carbide substrate of the first conductivity type, and a second layer of a second conductivity type formed on the first layer of the first conductivity type.

4. The method of claim 1, wherein the concave portion is formed so that the side surface of the concave portion and the surface of the silicon carbide substrate define an angle between 80° and 120°.

5. The method of claim 1, further comprising, after forming the concave portion and before irradiating the particle beam:

forming an epitaxial layer on at least the side surface of the concave portion.

6. The method of claim 1, wherein the particle beam is an ion beam.

7. The method of claim 6, wherein the ion beam is at least one ion beam selected from the group consisting of silicon, oxygen, nitrogen, hydrogen and inert gas ion beams.

8. The method of claim 6, wherein the energy of the ion beam is between 1 keV and 10 MeV.

9. The method of claim 6, wherein the ion implant dose is at least $10^{14}$ cm$^{-2}$.

10. The method of claim 1, wherein the particle beam includes at least two beams of different energies.

11. The method of claim 1, wherein the particle beam is irradiated while keeping the silicon carbide substrate at a temperature of not more than 500° C.

* * * * *